Aug. 17, 1965 T. M. ELFVING 3,200,600

THERMOELECTRIC ICE-FREEZER

Filed July 1, 1964 4 Sheets-Sheet 1

INVENTOR.
THORE M. ELFVING
BY
Fleit & Swain

Aug. 17, 1965 T. M. ELFVING 3,200,600

THERMOELECTRIC ICE-FREEZER

Filed July 1, 1964 4 Sheets-Sheet 2

INVENTOR.
THORE M. ELFVING
BY
Fidelr & Lerain

Aug. 17, 1965 T. M. ELFVING 3,200,600

THERMOELECTRIC ICE-FREEZER

Filed July 1, 1964 4 Sheets-Sheet 3

INVENTOR.
THORE M. ELFVING
BY
Fleler & Swain

INVENTOR.
THORE M. ELFVING
BY
Flehr & Swain 3,200,600

THERMOELECTRIC ICE-FREEZER

Thore M. Elfving, 433 Fairfax Ave., San Mateo, Calif.
Filed July 1, 1964, Ser. No. 379,692
7 Claims. (Cl. 62—3)

The present invention relates generally to thermoelectric cooling devices and particularly to thermoelectric ice-freezers or solidifiers. Hitherto used thermoelectric ice-freezers generally comprise liquid drawers or containers in contact with a cold surface cooled by thermoelectric thermocouple assemblies. This design usually results in interface temperature drops which lowers the efficiency of the thermoelectric heat pumping assembly.

In my copending application Serial No. 343,678, there is described a thermoelectric refrigeration system suitable for ice-freezing in vertical pipes comprising sections which are in themselves the cold junction bridges of a thermoelectric heat pump. The present invention incorporates features of the invention disclosed in said copending application in an ice-freezer suitable for the freezing of ice cubes.

The thermoelectric ice-freezer, according to the present invention, is characterized by a maximum heat transfer rate between the cold junctions and the liquid to be frozen resulting in maximum ice freezing capacity and efficiency at a given temperature of said cold junctions.

It is an object of this invention to provide a thermoelectric ice-freezer in which the ice freezing takes place in metal containers or cups which constitute cold junction bridges in a thermoelectric heat pump assembly.

It is another object of the invention to provide an ice-freezer in which the release of ice cubes from the cavities formed inside the cold junction bridges is obtained by switching the polarity of the direct current supply so that the cold junction bridges become hot junction bridges, thereby melting the ice in immediate contact with the metal walls of the hollow junction bridges.

Additional objects and features of my invention will appear from the following description in which an embodiment of the invention is described with reference to the accompanying drawings.

Referring to the drawings.

Figure 1:
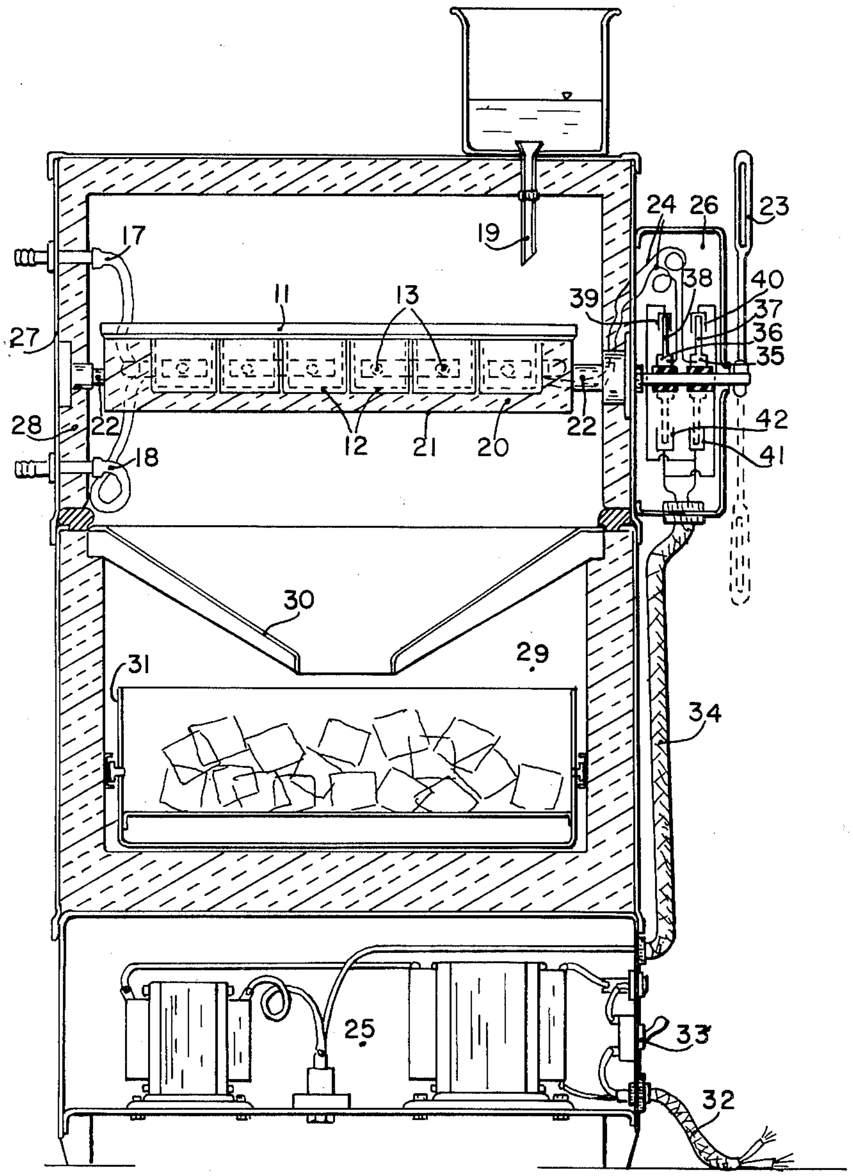
FIGURE 1 is a sectional elevation view of a thermoelectric ice-freezer incorporating the present invention.
Figure 2:
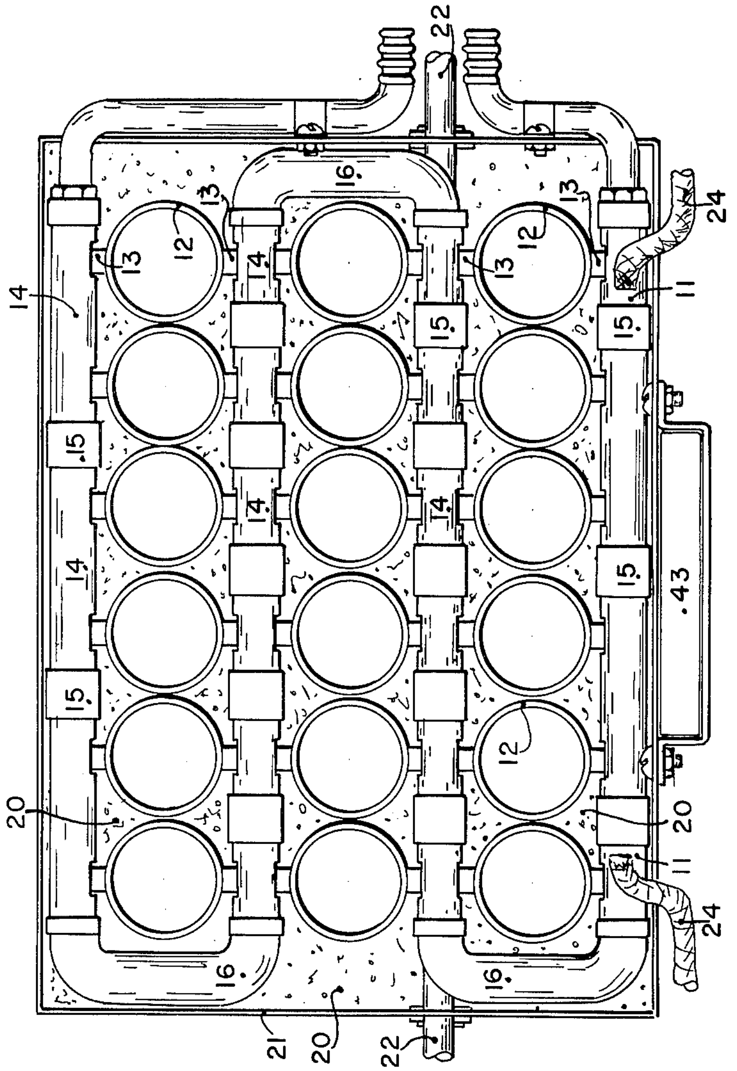
FIGURE 2 shows in plane view details of the thermoelectric ice-freezer assembly with cold junction in the form of water containers or cups.

Referring to FIGURES 1 and 2, there is shown an ice-freezer assembly 11 comprising cold junction bridges in the form of cup-shaped water reservoirs (cups) 12 of a size corresponding to ordinary ice cubes. The cold junction bridges 12 are connected to the cold junctions of semiconducting p and n-type blocks or pellets 13. The hot junction sides of the pellets 13 are connected to metal tube sections 14. The metal tube sections 14 are arranged in straight rows and interconnected by overlapping rings 15 of an insulating material like Teflon. The tube sections and rings are glued together to form continuous water pipes 16. Instead of rings 15, the sections 14 can be united by Teflon tape. The water pipes 16 are in series and connected by flexible hoses to an outside water system by inlet and outlet pipes 17 and 18, respectively. The ice-freezing cups are filled with water via the pipe 19 communicating with a water supply such as a reservoir.

The ice-freezing assembly is embedded in insulating material 20 and placed in a tray 21 supported by shafts 22. The ice-freezer assembly can then be rotated or tilted on the shafts by the handle 23 attached to an extension of the shaft 22.

The thermoelectric ice-freezer assembly 11 is mounted inside a housing box 27 provided with an insulation 28. It is supported by means of the shafts 22 journalled in opposite walls. The insulated box 27 is located on top of an insulated storage chamber 29 provided with an ice cube funnel 30. The storage chamber 29 is preferably provided with a drawer 31, so that it can be moved out from the storage chamber to provide access to the ice cubes.

The thermoelectric ice-freezer assembly 11 is supplied with direct current through the leads 24 which are connected to the power supply 25 by the switch box 26. The power supply 25 is mounted under the ice storage chamber 29 and connected to an outside A.C. supply by the conduit 32 through a switch 33.

In the switch box the shaft 22 is provided with metal rings 35 and 36, respectively, which are electrically insulated from the shaft. The metal rings 35 and 36 are permanently connected to the thermoelectric assembly by the conductive leads 24. The rings 35 and 36 include radially extending knife-like conductive members 37 and 38, respectively, which fit between fixed pairs of contacts 39 and 40, and 41 and 42, respectively. These contact pairs are connected with the power supply in the way indicated by the drawing.

The ice freezer functions in the following way. With the handle 23 in the upright position shown in the drawing, the thermoelectric ice-freezer assembly is connected with the power supply in such a way that the junction bridges-water cups 12 constitute cold junction bridges of the thermoelectric heat pump assembly with the thermocouples in series. Ice freezing takes place with maximum efficiency due to the direct heat transfer and the absence of any interface temperature drops between the semiconductor material forming the junction legs and the cups. The hot junctions are cooled by cooling water running through the pipe connected to the hot junctions 14. After the ice is frozen, the handle 23 is turned downwards in the position indicated by dotted lines. The ice-freezer assembly in the tray is thereby turned upside down and still connected with the electric and the water supply over the flexible connections indicated in the drawing. When the shaft 22 is turned 180°, the knife members 37 and 38 are shifted from the contact pair 39 and 40 to the contacts 41 and 42 thereby reversing the polarity of the D.C. power supplied to the thermoelectric assembly. The cold junctions are now hot junctions, and the ice cubes in the cup-shaped junction bridges 12 will start to melt. This loosens the ice cubes which by the force of gravity fall into the funnel 30 and into the ice cube storage chamber or drawer.

By arranging the shaft 22 in an eccentric position in relation to the ice cups 12, the tray can be so balanced by a weight 43 (FIGURE 2) that it stays in an upside down position as long as the ice cubes are in the cups 12. When the ice has been released, the balance is shifted so that the tray automatically turns to a vertical position with the weight 43 at is lowest point. In this position of the shaft, the knives 37 and 38 are disconnected from the power supply contacts and the thermoelectric assembly is no longer energized. The water supply can, by known means, be connected in the same way to the assembly so that no cooling water is flowing through the pipes. In this position of the shaft, repeated ice freezing can take place after again rotating the handle 23 in an upright position and pouring water into the water cups 12.

The cold junction bridges in the form of individual ice cube containers shown in FIGURES 1 and 2 can have any desired shape. Instead of cylindrical walls, the containers can be made from square or rectangular metal profiles provided with a bottom of metallic or non-conductive material. The individual ice cube containers can be interconnected by holes or pipes between the walls so that filling can take place from one point. Filling can also take place by overflow from one container to the others if the surrounding tray has higher walls than the ice container. The hot junction bridges comprising metal pipe sections separated by non-conductive rings 15, or by non-conductive tape material, forming strong continuous water pipes can be electrically insulated from the cooling water by a ceramic lining, preferably made from a material with high heat conductivity such as alumina or beryllium oxide. The compound water pipe can be made from a thin continuous ceramic pipe with a wall thickness as thin as .010 inch. This thin ceramic pipe is metallized in sections corresponding to the hot junctions 14. Each such metallized section can be provided with a copper tube soldered thereto or bonded with a thin copper band in several solder layers with a width corresponding to the width of the metallized sections or approximately the desired width of the hot junctions. Overlapping these soldered copper band sections, strips of a suitable heat resistant plastic tape metal, such as Teflon, can be wrapped and glued by a suitable glue, such as epoxy, around the edges of the copper sections so that a strong structure of alternate copper strips and Teflon strips in several layers are formed outside the thin and relatively fragile ceramic pipe. A compound pipe of this type with an inside thin ceramic pipe offers a good heat transfer between the cooling water and the hot junction bridges and can be treated in the same way as compound pipe comprising, for instance, bare copper tube sections separated by Teflon rings.

According to the invention, the semiconducting pellets 13 of p and n-type can be soldered to both or one side of the hot junction sections 14 in the described compound pipes by simply passing a liquid of a suitably controlled temperature through the pipe as soldering takes place. A suitable liquid is, for instance, glycerine, which can be heated to say +145 to +150% C. for the soldering of the semiconducting material to the copper sections with a solder such as bismuth-tin having a melting point at +138 to +140 C. being used. The semiconducting pellets or blocks are preferably pretinned to a suitable thickness so that no additional solder material has to be added.

Figure 3:
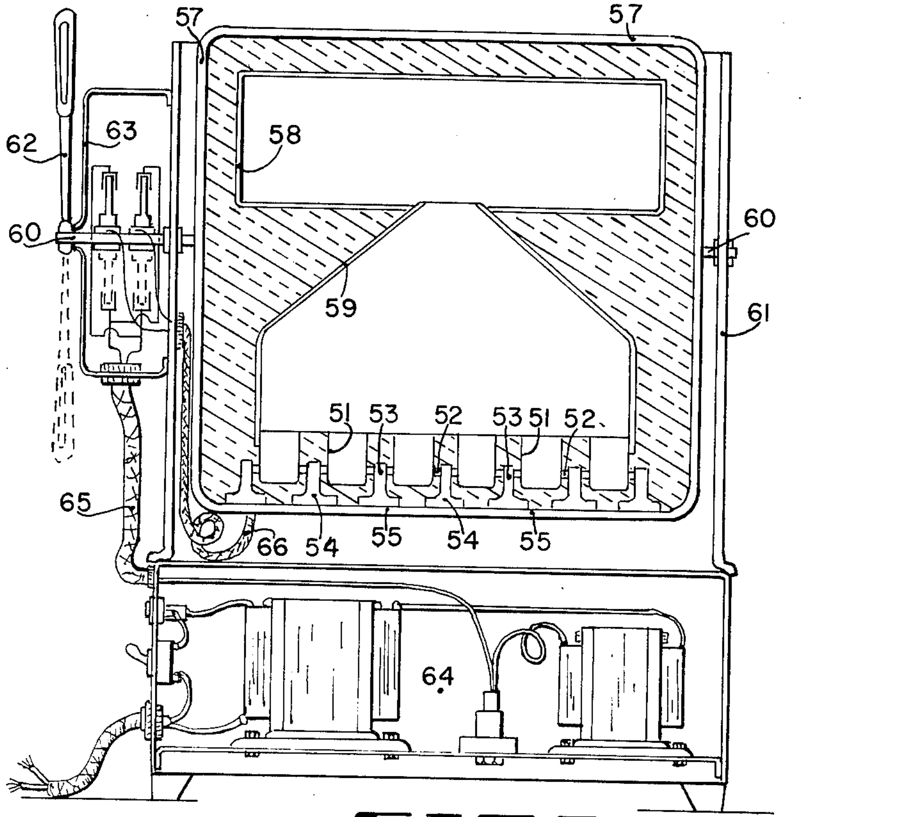
FIGURE 3 shows in section view an air-cooled embodiment of the thermoelectric ice-freezer assembly.
Figure 4:
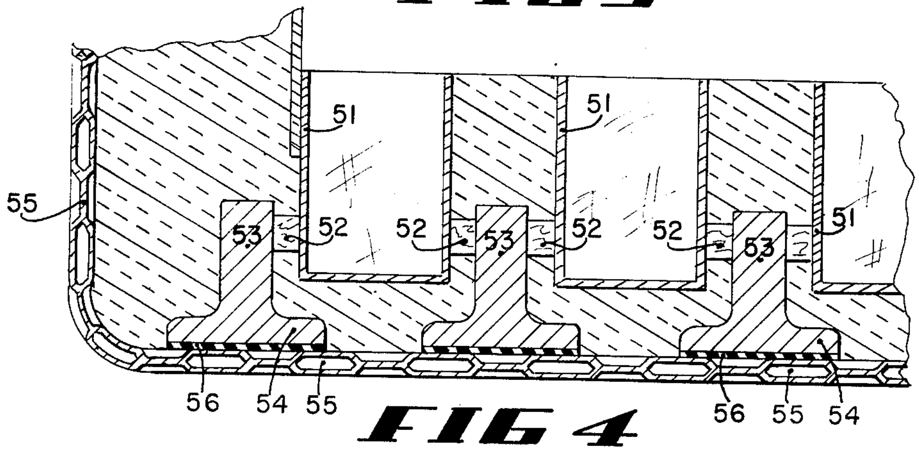
FIGURE 4 is an enlarged view of a portion of the ice-freezer assembly of FIGURE 3.

FIGURES 3 and 4 show an air-cooled version of the ice freezer. The thermoelectric assembly has, as before, cold junction bridges 51 in the form of water cups or individual ice cube containers. These cups can be of many different shapes with parallel or conical side walls. The cold junction bridges 51 are connected to semiconducting blocks or pellets 52 which, on their hot junction side, are soldered to hot junction bridges in the form of solid copper rods 53. The copper rods 53 are provided with an extended surface base 54 through which heat from the hot junction bridges 53 is conducted to a double-walled heat transferring panel 55 filled with a suitable refrigerant such as Freon. The base 54 of the copper rods 53 are in intimate thermal contact with the panel 55 but electrically insulated therefrom by thin metallized ceramic wafers 56 soldered to the rods 53 and the panel 55 respectively. The heat transferring panel 55 can be the rollbond type and bent into a square or rectangular structure 57 enclosing the whole ice freezing assembly as indicated in FIGURE 1. In the structure 57 is arranged an insulated container 58 communicating with the ice freezing assembly through the insulated funnel 59. The rollbond structure 57 is provided with a shaft 60 supported by the stand 61 in such a way that the whole structure 57 can be turned in an upside down position by the handle 62. On the stand 61 is arranged a switch box 63 similar to the one described under FIGURES 1 and 2. Under the stand 61 is arranged a power supply 64 connected to the switchbox through the cable 65 and supplying the ice freezing thermoelectric assembly with direct current through the cable 66. Ice freezing takes place in the way previously described with direct heat transfer between the cold junction bridges 57. The cups may be filled in the way described above. Heat from the hot junction bridges in the form of the copper rods 53 is conducted to the double-walled heat transfer panel 55 where refrigerant evaporates in the lower horizontal portion and condenses with heat dissipation in the air-cooled upper portions 57 of the panel 55.

After ice is frozen, the handle 62 is placed in the indicated lower position thereby turning the panel 55 upside down, at the same time changing the polarity of the direct current through the switchbox 63. In this position, the cold junctions become hot junctions and the ice starts melting until it is released and falls through the funnel 59 to the chamber 58 where the ice cubes are collected. After turning the panel 55 in the ice freezing position, the ice freezing can be repeated again after filling water in the cold junction cups 51.

Figure 5:
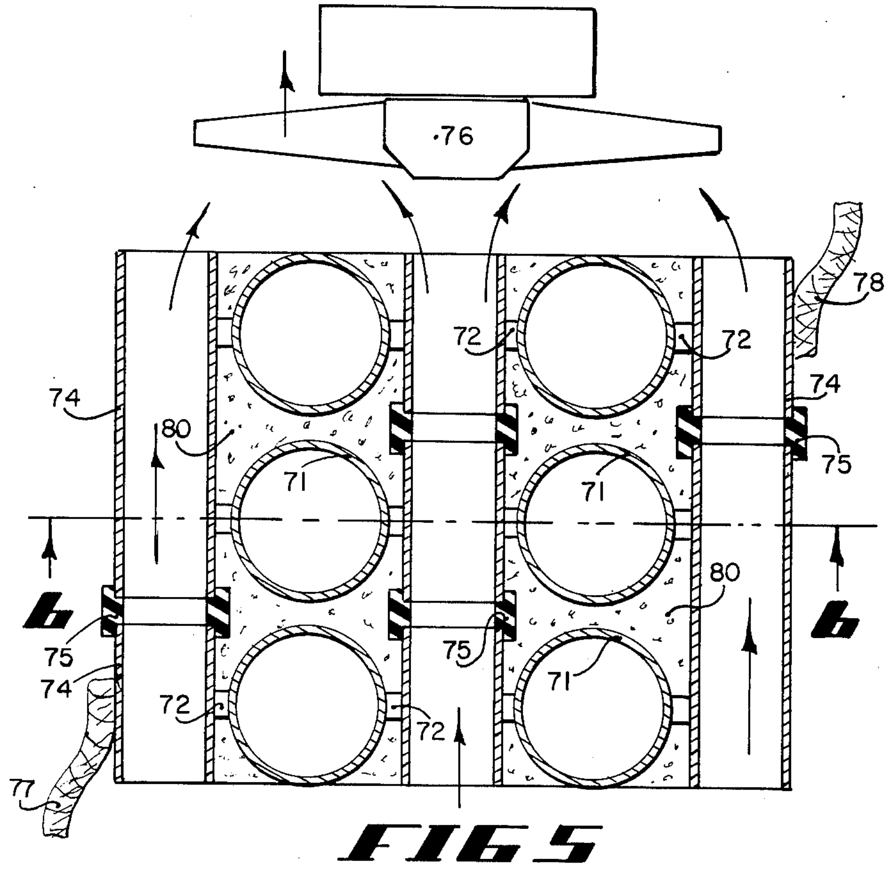
FIGURES 5 and 6 schematically show still another embodiment of an air-cooled ice-freezer assembly according to the invention.
Figure 6:
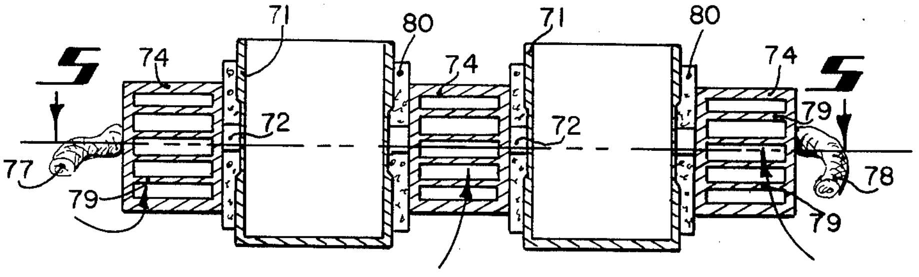

FIGURES 5 and 6 show another embodiment of an air-cooled ice freezer according to the invention. Ice freezing cold junction cups 71 are, as before, directly soldered to semiconducting pellets 72 which, on their hot junction side, are connected to hot junction bridges in the form of hollow copper sections 74. The sections 74 are connected to each other by Teflon sections or Teflon tape material 57 to form straight lines of air channels through which cooling air is circulated by means of the fan 76. The thermoelectric assembly comprising "thermocouples" in series with hot junction copper sections 74 of different length is supplied by direct current through the leads 77 and 78 to the first and the last hot junction bridges. The size of the air-cooled hot junction bridges in the form of hollow copper sections 74 is limited because of the Joule's heat formed in the junction bridges. The resistance can be reduced by cross members 79 placed in such a direction that they serve both as conductors for the current across the junction bridge and as heat exchange extended surfaces for the cooling air forced through the hot junction bridges. The ice freezing assembly can be provided with devices for filling water in the cups 71 and for release of ice after freezing by reversing the current in the way previously described. The cups 71 are suitably provided with an insulation 80 as indicated in the drawings.

I claim:

1. A thermoelectric heat pump assembly comprising a plurality of bodies of semiconductive material of opposite conductivity types, hot and cold junction bridges connected between bodies of opposite conductivity type, said cold junction bridges being in the form of metal containers for receiving a liquid to be cooled with opposite walls of said cold junction bridges connected directly to the bodies of semiconductive material.

2. A thermoelectric heat pump assembly as in claim 1 in which the hot junction bridges are in the form of hollow metal sections through which a cooling fluid is circulated.

3. A thermoelectric heat pump assembly as in claim 2 in which said metal sections are arranged in straight rows and joined to one another by sections of nonconductive material.

4. A thermoelectric heat pump assembly as in claim 3 in which said hollow metal sections forming the hot junction bridges have opposite sides soldered directly to semiconductor bodies of opposite conductivity type and in which the inside of said hollow metal sections include a plurality of fins or bridges extending between the opposite sides, said metal fins or bridges serving both as electric conductors and extended heat exchange surfaces for heat exchange to a cooling fluid passing through the metal sections.

5. A thermoelectric heat pump assembly as in claim 1 including a double-walled heat transferring panel containing a refrigerant, said panel having a heat dissipating and a heat absorbing portion, and in which the hot junction bridges are in the form of metal rods, said metal rods being electrically insulated but thermally connected to the heat absorbing portion of said heat transferring panel.

6. An ice freezer including an insulated housing, a thermoelectric heat pump assembly comprising a plurality of body of semiconductive material of opposite conductivity types, hot and cold junction bridges connected between bodies of opposite conductivity type, said cold junction bridges being in the form of metal containers for receiving a liquid to be cooled with opposite walls of said cold junction bridges connected directly to the bodies of semiconductive material, a horizontal base for supporting and mounting said thermoelectric heat pump assembly, a shaft rotatably supporting said base on said insulated housing, means for rotating said shaft and the base, means for providing direct current to said thermoelectric heat pump assembly, and means for switching the polarity of direct current supplied to said assembly when said shaft is turned through a predetermined angle.

7. An ice freezer as in claim 6 including an insulated ice storage compartment disposed below said thermoelectric heat pump assembly whereby to receive ice formed in said containers.

References Cited by the Examiner

UNITED STATES PATENTS

| | | | |
|---|---|---|---|
| 2,026,214 | 12/35 | Chilton | 62—345 |
| 2,487,408 | 11/49 | Askin | 62—345 |
| 3,055,185 | 9/62 | Lundstrom | 62—352 |
| 3,146,601 | 9/64 | Gould | 62—3 |

ROBERT A. O'LEARY, *Primary Examiner.*

UNITED STATES PATENT OFFICE

CERTIFICATE OF CORRECTION

Patent No. 3,200,600 August 17, 1965

Thore M. Elfving

It is hereby certified that error appears in the above numbered patent requiring correction and that the said Letters Patent should read as corrected below.

Column 4, lines 57 and 58, and column 5, line 16, strike out "opposite walls of", each occurrence.

Signed and sealed this 10th day of May 1966.

(SEAL)
Attest:

ERNEST W. SWIDER
Attesting Officer

EDWARD J. BRENNER
Commissioner of Patents